United States Patent [19]

Hughes

[11] Patent Number: 4,706,027
[45] Date of Patent: Nov. 10, 1987

[54] METHOD FOR CORRECTING PHASE ERRORS IN MAGNETIC RESONANCE IMAGING DATA

[75] Inventor: Simon H.C. Hughes, Curnee, Ill.

[73] Assignee: Kabushiki Kaisha Toshiba, Kawasaki, Japan

[21] Appl. No.: 901,253

[22] Filed: Aug. 28, 1986

[51] Int. Cl.$^4$ ............................................. G01R 33/20
[52] U.S. Cl. ..................................... 324/309; 324/312
[58] Field of Search ............... 324/300, 307, 306, 308, 324/309, 311, 312, 313, 314

[56] References Cited

U.S. PATENT DOCUMENTS 4,625,170 11/1986 Yamamoto ........................... 324/307
4,649,346 3/1987 Yeung et al. ........................ 324/312

OTHER PUBLICATIONS

"NMR Fourier Zeugmatography", Kumar et al., Journal of Magnetic Resonance, vol. 18, pp. 69-83, (1975).

Primary Examiner—Michael J. Tokar
Attorney, Agent, or Firm—Finnegan, Henderson, Farabow, Garrett & Dunner

[57] ABSTRACT

A two dimensional Fourier transform magnetic resonance imaging method produces a series of scan lines in Fourier space using quadrature demodulation of a series of radio frequency echo signals from an object being observed with a reference signal. Fourier transforming the scan line data provides visual image data through a section of the object. Limitations in the hardware performance introduces unknown, time varying, phase errors into the scan line data, proportional to the phase difference between the reference signal and the echo signals as each is demodulated. Improved visual imaging results from the introduction of an additional sensitive line scan through $Y=0$ in Fourier space, having a calculable phase error which is used to correct the unknown phase errors in the remaining scan lines. The phase term of the sensitive line data is corrected for the phase error which is known at $Y=0$. Magnetic resonance imaging scan line data are next generated for a slice through the object. Because the phase of the sum of the data for each scan line must be the same as that of the sensitive line data for corresponding values of Y, the scan line phase error may be calculated and removed from the phase of each scan line.

5 Claims, 5 Drawing Figures

METHOD FOR CORRECTING PHASE ERRORS IN MAGNETIC RESONANCE IMAGING DATA

BACKGROUND OF THE INVENTION

I. Field of the Invention

The present invention relates to a method for removing phase errors in digitized Magnetic Resonance Imaging (MRI) data resulting from quadrature demodulation of an MRI echo signal from an observed object.

II. Background Information

A Two Dimensional Fourier Transform MRI system such as that discussed by A. Kumar, et al. in *NMR Fourier Zeugmatography*, J. Magn. Reson. 18:69–83, 1975, subjects an object, such as a human body, to a series of magnetic fields and radio frequency (RF) pulses. The RF pulses resonate selected atoms in the object as a consequence of the characteristics of the atoms, the magnetic fields, and the RF pulses. The resonant atoms precess in the magnetic fields and radiate a detectable RF echo signal containing information about the location of the radiating atoms. As is well known to those skilled in the art, the echo, when quadrature demodulated by a reference signal, is the two dimensional Fourier transform (2D FT), designated F(X,Y), of the signal intensity per unit area, designated f(x,y), of the selected atoms in a slice through the object. The function f(x,y) represents the spatial distribution of the resonant atoms and their relaxation times in the object, and is used to construct a visual image of a slice through the object. Because of unknown and time varying differences between the phase of the echo signal from the object and the quadrature demodulation reference signal, the demodulation process introduces a time varying phase error signal into the MRI data that distorts the final visual image.

In the 2D FT technique, the object, shown oriented in a space coordinate system in FIG. 1, is subjected to a static magnetic field, usually parallel to the z axis. In addition, the object is also subjected to gradient magnetic fields. In a typical gradient field, the direction of the field is parallel to the static field, but the magnitude of the field at any point in space is proportional to either the x, y, or z coordinate. By proper selection of the magnitudes and durations of the magnetic gradient fields, data points represented by the function G(X,Y) can be collected along specific paths of the Fourier Space plane defined by:

$$X(t) = \frac{\gamma}{2\pi} \int_0^t g_x(\tau)d\tau, \text{ and}$$

$$Y(t) = \frac{\gamma}{2\pi} \int_0^t g_y(\tau)d\tau,$$

where $g_x(t)$ is the "read" magnetic field gradient with a gradient direction parallel to the x-axis, $g_y(t)$ is the "encode" magnetic field gradient with a gradient parallel to the y-axis, and $\gamma$ is the magnetogyric ratio of the atoms under observation. These gradients are typically measured in "field per unit length," for example T/cm, and the equations assume that a time origin t=0 has been suitably defined.

To produce the measured data function, G(X,Y), the RF echo signal from the object must be quadrature demodulated. Because of instabilities in the frequency of the quadrature demodulation reference signal oscillator, a phase shift error that varies with time in an unknown manner is introduced into the measured data. Because of this phase error, G(X,Y) is related to the desired data by the relationship:

$$G(X,Y) = e^{i\Phi(m)} \cdot F(X,Y),$$

where $e^{i\Phi(m)}$ is the phase error introduced by the demodulation process, m is the number of the path parallel to the X-axis in Fourier space and is related to Y by the equation:

$$Y = m \cdot \Delta Y$$

where $\Delta Y$ is the Fourier space distance between successive paths, and F(X,Y) is the desired data function corrected for phase errors, which may be transformed into f(x,y) and the final visual image.

FIG. 2 shows a series of 2D FT stepwise paths in Fourier space. The time needed to scan along one path is very short, being on the order of tens of milliseconds, as compared to the time needed to make successive scans on each step, which takes on the order of a few seconds per step. A scan through one slice of an object comprising many steps on the Fourier plane takes time on the order of several minutes, during which time the quadrature demodulation reference oscillator may vary in phase and frequency by a significant, but unknown amount. Because f(x,y) is real, F(X,Y) is real at the origin of Fourier space and the phase of the complex number F(0,0) is zero. Thus, in the absence of the phase errors, $e^{i\Phi(m)}$, the phase of G(O,O) would also be zero. Any phase term measured in G(O,O) must, therefore, be the phase error resulting from the demodulation process, and that error can be calculated at the origin. However, the phase error varies in an unknown manner with time, and the value calculated at the origin of Fourier space may not apply at large distances from the origin, representing relatively long time periods.

Phase correction is straightforward in projection reconstruction (PR) scans but is a problem in 2D FT scans. In the PR scan, every echo collected is a central section of the transform and is therefore known to be real at the origin. Because of this, the phase error can be calculated and removed. For the echoes in a 2D FT scan, this central section property is not true, and the same correction is not applicable. As noted above, during the time period of an entire scan, the phase error calculated at the origin does not necessarily apply to data at remote locations from the origin, since the demodulation oscillator may vary with time by a significant, but unknown amount during the long time period needed to take successive scan echoes.

Accordingly, there exists a need for a technique to correct quadrature demodulation phase errors in 2D FT signals over the entire expanse of a Fourier space plane, that takes into consideration reference signal oscillator instabilities over the relatively long time periods needed to measure multiple scans through an entire slice of an object.

SUMMARY OF THE INVENTION

It is, accordingly, an object of the present invention to provide a method to remove the quadrature demodulation phase error introduced into each 2D FT scan line on a Fourier plane.

Additional objects and advantages of the invention will be set forth in the description which follows, and in part will be obvious from the description, or may be learned by practice of the invention.

To achieve the foregoing objects, and in accordance with the purposes of the invention as embodied and broadly described herein, a method is provided for correcting phase errors in magnetic resonance imaging data from an object under observation, comprising the steps of: (a) subjecting the object to magnetic field gradients and radio frequency pulses to produce sensitive line data and two dimensional Fourier transform (2D FT) magnetic resonance imaging data from the object, the magnetic field gradients defining a Fourier space, with the sensitive line data passing through Y=0 in the Fourier space and the 2D FT data lying along stepped paths in the Fourier space; (b) measuring the phase of the sensitive line data at Y=0 in the Fourier space; (c) modifying the sensitive line data as a function of the measured phase to obtain corrected sensitive line data which is equivalent to the sensitive line data with the effect of a first phase error in the sensitive line data removed; (d) calculating a second phase error in each of the 2D FT data on each of the stepped paths as a function of the corrected sensitive line data and the sum of the 2D FT data for each of the stepped paths; (e) modifying the 2D FT data on each of the stepped paths as a function of the calculated second phase errors for each respective path to obtain corrected 2D FT data for each path which is the equivalent of the 2D FT data for each path with the effect of the respective second phase errors for each path removed; and (f) constructing a visual magnetic resonance image from the inverse two dimensional Fourier transform of the corrected 2D FT data.

Preferably, the first data passing through the origin of Fourier space is generated along the Y-axis. It is also preferable that the second data be generated along stepped paths in Fourier space that are parallel to the X-axis, and that each stepped path cross the line formed by the first data at least once.

DESCRIPTION OF THE PREFERRED EMBODIMENT

The method of the subject invention for calculating and correcting the phase error of MRI data can be described in terms of continuous or discrete functions. To demonstrate the fundamental ideas of this invention most clearly, the equations shown herein represent continuous functions which may be digitally sampled to obtain discrete data points used for making calculations on a digital computer.

Figure 3:
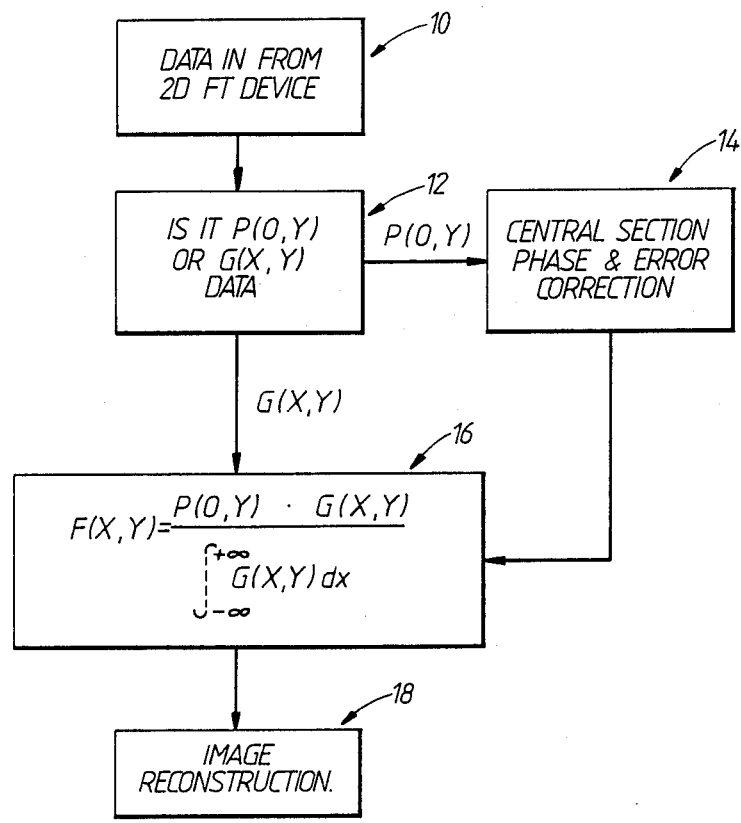
FIG. 3 is a logic diagram showing a phase error correction method according to the teachings of the subject invention.

A method for correcting phase errors in MRI data in accordance with the teachings of the present invention is illustrated by the logic diagram in FIG. 3 which includes step 10 during which MRI data is generated, either as a sensitive line scan or as 2D FT data or a slice through the observed object; step 12 during which a decision is made whether the MRI data is a sensitive line scan or 2D FT image data from a slice of the observed object; step 14 during which correction is undertaken of the sensitive line scan data for quadrature demodulation phase errors by measuring the data phase term at Y=0 in Fourier space; step 16 during which calculation is performed of the phase error for each 2D FT scan line and the phase error is removed from the data; and step 18 during which a visual image is constructed from the corrected 2D FT data.

Generally, the first step of the subject invention requires the process of exciting an object using magnetic fields and radio frequency pulses from a standard 2D FT device, with the objective of causing the object to emit a radio frequency (RF) signal proportional to the proton spin density, the spin-lattice relaxation time, and the spin-spin relaxation time of the object along a narrow linear volume. This process may be referred to as a sensitive line scan technique.

Figure 1:
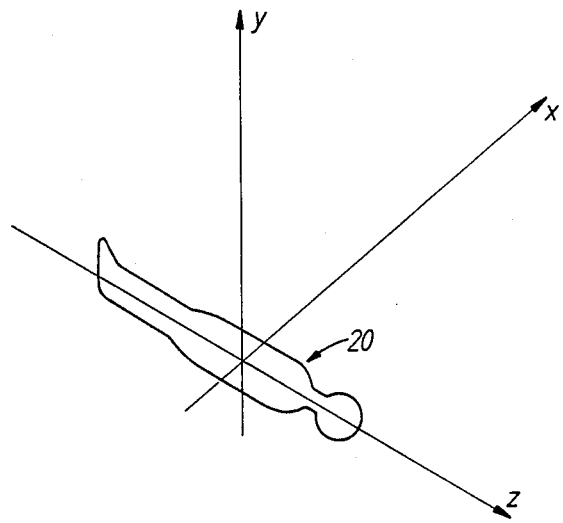
FIG. 1 is a diagram of an object oriented within a three dimensional orthogonal coordinate system.
Figure 4:
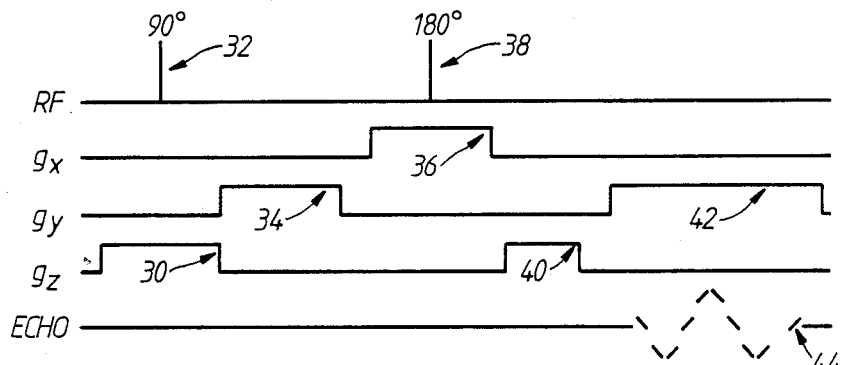
FIG. 4 is a series of time lines showing the time occurrences of the magnetic field gradients and radio frequency signals comprising a sensitive line scan technique.

For purposes of illustrating a sensitive line scan technique, consider an object 20, assumed to be a patient, as shown in FIG. 1 aligned in a standard three dimensional space coordinate system. A sensitive line scan technique involves the application of radio frequency pulses and magnetic gradients as shown in FIG. 4. The magnetic gradients in FIG. 4 all have field directions parallel to the z-axis. As shown in FIG. 4 by way of example and not limitation, a first magnetic field gradient 30 with a gradient direction parallel to the z axis is applied to object 20. Next, object 20 is excited with a RF pulse 32 sufficient to rotate resonant nuclei in object 20 to 90° with respect to the applied field. Field 30 is removed and a magnetic field gradient 34, with a gradient parallel to the y-axis, is then applied to object 20. Field 34 is next removed and a magnetic field gradient 36 with a gradient parallel to the x-axis, is applied to object 20. Object 20 is thereafter simultaneously excited with a RF pulse 38 sufficient to rotate resonant nuclei in the object 180° so that they are again perpendicular to the static field direction. Field 36 is then removed and a magnetic field gradient 40 with a gradient direction parallel to the z axis is applied. Field 40 is removed and a magnetic field gradient 42 with a gradient direction parallel to the y-axis is applied to the object. While object 20 is subject to field 42, the RF echo signal 44 resulting from the precession of excited nuclei in object 20 is received by the MRI system. Field 42 is then removed.

The received sensitive line echo signal is quadrature demodulated and digitized in the normal manner resulting in a set of one dimensional discrete data values represented by the function P(O,Y). The RF and magnetic field gradients in FIG. 4 illustrate a suitable pulse sequence which might be used to generate this sensitive line data. Other pulse sequences could be substituted, subject to the preference that they generate data P(O,Y) which is related to the 2D FT data by the equation:

$$P(O,Y) = \int F(X,Y)dX$$

except in as much as they are subject to the phase errors noted below.

As a result of phase differences between the quadrature demodulation reference signal and the echo signal, the phase of P(O,Y) may be in error. The time needed to generate one sensitive line scan is short, on the order of 10 milliseconds. As a consequence, the quadrature demodulation reference oscillator signal's phase can be assumed constant for the duration of the sensitive line scan, thus the phase error in P is independent of Y and has the same value for Y=0 as for any other value of Y. Since the correct value of the phase of P(O,O) is known to be zero, the phase error may therefore be calculated by examining the phase of the complex number P(0,0). From this estimate of the phase error in P, P(O,Y) can be corrected to remove the effects of the phase error over the entire range of Y values in a manner well known to those skilled in the art.

Figure 2:
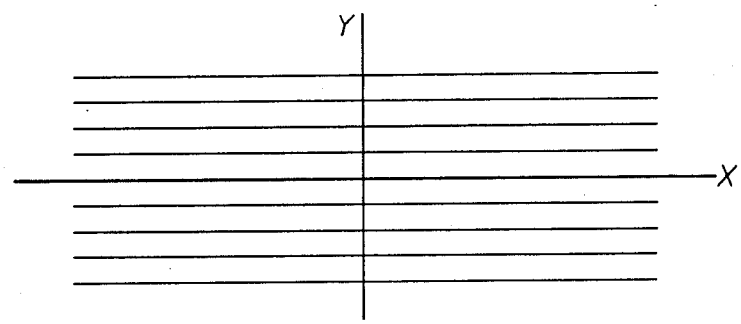
FIG. 2 is a graph showing paths traced in the Fourier space plane of the 2D FT scan data through a slice of the object illustrated in FIG. 1.
Figure 5:
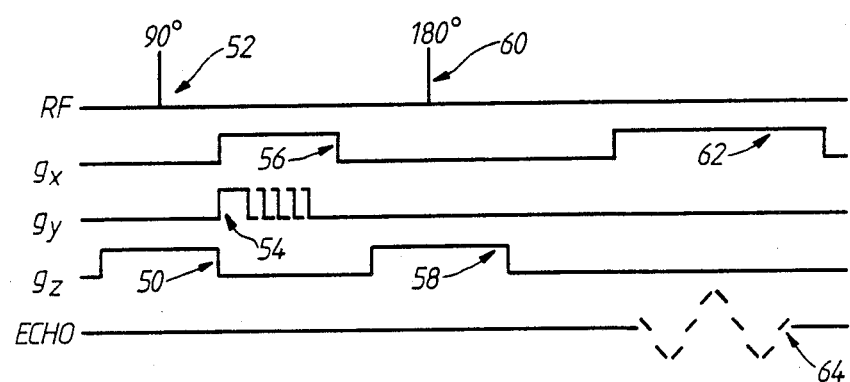
FIG. 5 is a series of time lines showing the time occurrences of magnetic field gradients and radio frequency signals comprising a 2D FT technique.

The next step of the subject invention requires exciting an object using magnetic and radio frequency fields from a typical MRI device using any one of several 2D FT pulse sequences well known to those skilled in the art and resulting in a "slice" selection through an object. One illustrative example of exciting object 20 involves the selection of RF pulses and magnetic field gradients as shown in FIG. 5. The magnetic field gradients in FIG. 5 all have field directions parallel to the z axis. First, a magnetic field gradient 50 with a gradient direction parallel to the z axis is applied to the object. Next, object 20 is excited with a radio frequency (RF) pulse 52 sufficient to rotate resonant nuclei in the object to 90° with respect to the applied field. Field 50 is removed and a magnetic field gradient 56 with a gradient parallel to the x-axis is applied to object 20. At the same time, a magnetic field gradient 54 with a gradient parallel to the y-axis is applied to object 20. Field 54 may be varied in duration on successive scans to cause scan lines plotted in Fourier space to step to higher values of Y as shown in FIG. 2, forming a series of stepped paths. Field 54 is removed, then field 56 is removed, and a magnetic field gradient 58 with a gradient parallel to the z axis is applied to the object. The object is simultaneously excited with a RF pulse 60 sufficient to rotate resonant nuclei in the object 180° with respect to the field direction. Field 58 is thereafter removed and a magnetic field gradient 62 parallel to the x-axis, is applied. While object 20 is subject to field 62, the RF echo signal 64 resulting from the precession of excited nuclei in the object is received by the MRI system. Field 62 is then removed.

The scan of FIG. 5 is repeated several times with different durations of magnetic field gradient 54 until sufficient scan lines are obtained to define a slice through the object. The received RF echo signals are quadrature demodulated and digitized in the normal manner resulting in data represented by the function G(X,Y). The magnetic field gradients in FIG. 5 are chosen to generate G(X,Y) data along several stepped paths parallel to the X-axis and passing through the Y-axis in Fourier space, as shown in FIG. 2.

As a result of uncertainties in the phase of the quadrature demodulation reference signal, an arbitrary and unknown multiplicative phase factor, or phase error, exists in G(X,Y) for each stepped path.

The next step of the invention involves using the data gathered in the prior steps to calculate the effects of the phase error on the phase term of G(X,Y) in each stepped path, and then correct the data values of G(X,Y) to obtain corrected data.

In a typical MRI device, the visual image of a slice through object 20 is constructed from the signal intensity per unit area of the slice, f(x,y). F(X,Y) is the two dimensional Fourier transform of f(x,y). Using continuous functions to represent the digitized data, the measured data, G(X,Y), are related to the desired data F(X,Y) as follows:

$$G(X,Y) = e^{i\Phi(m)} \cdot F(X,Y)$$

where $e^{i\Phi(m)}$ is the phase error resulting from the uncertainties in the phase of the RF signal used in the quadrature demodulation of the RF echo signal, and m is an integer representing each successive scan line.

The exact points, (X, Y), at which the data samples are taken are determined by the times at which digitization occurs and by the history of the gradients up to that time. The Fourier space dimensions X and Y are functions of time given by:

$$X(t) = \frac{\gamma}{2\pi} \int_0^t g_x(\tau)d\tau, \text{ and}$$

$$Y(t) = \frac{\gamma}{2\pi} \int_0^t g_y(\tau)d\tau,$$

where $g_x(t)$ and $g_y(t)$ are magnetic fields with gradients in the x and y directions, respectively, and $\gamma$ is the magnetogyric ratio.

Since the phase of the sum of the values along each scan line (or the equivalent integral of the continuous function G(X,Y)) should have the same value as the phase term of the sensitive line scan for corresponding values of Y, any phase difference between the two must be the result of the multiplicative phase error, $e^{i\Phi(m)}$. Knowing this, the phase error $e^{i\Phi(m)}$ can be calculated for the data on each stepped path. Since one scan line takes a small period of time, the phase error may be assumed constant over the entire stepped path, and may therefore be removed from all values of G(X,Y) on each stepped path, leaving the desired data, represented by function, F(X,Y).

More specifically, define the function P(x,Y) as:

$$P(x,Y) = F_x^{-1}[F(X,Y)]$$
$$= F_y[f(x,y)]$$

where $F_x^{-1}$ is the inverse Fourier operator with respect to x, and $F_y$ is the Fourier operator with respect to y. From the definition of the Fourier transform operator, $$\int_{-\infty}^{+\infty} F(X,Y) \cdot e^{2\pi i \times X} dX = P(x,Y), \text{ and}$$

$$\int_{-\infty}^{+\infty} F(X,Y) dX = P(O,Y).$$

By substituting x=0 in the definition of P and using the relationship between G(X,Y) and F(X,Y), $$\int_{-\infty}^{+\infty} G(X,Y) dX = e^{i\Phi(m)} \cdot \int_{-\infty}^{+\infty} F(X,Y) dX$$
$$= e^{i\Phi(m)} \cdot P(O,Y)$$

where P(O,Y) represents the sensitive line scan data taken in the first step, and for digitized data, P would be related to the sum of the G data. The phase error $e^{i\Phi(m)}$ can therefore be estimated by:

$$e^{i\Phi(m)} = \frac{\int_{-\infty}^{+\infty} G(X,Y)dX}{P(O,Y)}.$$

The desired data function F(X,Y), corrected for phase errors in the manner described, may now be calculated from the actual data collected by using the relation:

$$F(X,Y) = \frac{G(X,Y)}{e^{i\Phi(m)}}$$

Note that this equation is of the general form:

$$|F| \cdot e^{i\theta} = \frac{|G| \cdot e^{i(\theta+\Phi)}}{e^{i\Phi}}$$

where $\theta$ is the error free phase, and $\Phi$ is the phase error. The division by $e^{i\Phi}$ has the effect of subtracting the phase error from G. By substituting for $e^{i\Phi(m)}$:

$$F(X,Y) = \frac{P(O,Y) \cdot G(X,Y)}{\int_{-\infty}^{+\infty} G(X,Y)dX},$$

where it is assumed that P(O,Y) has already been corrected for its own phase error.

The final step involves construction of a visual image of the object by inverse Fourier transformation of the F(X,Y) data by methods well known to those skilled in the art. Thus, according to the present invention, resulting MRI data may be corrected for phase error to provide more accurate magnetic resonance images, yet require less than 1% increase in total scanning time. The method of the present invention also has the advantage of being insensitive to the timing of the data sampling used in digitizing the echo signals since the phase error calculation is based on the value of:

$$\int G(X,Y)dX,$$

and not on G(X,Y).

In the preferred embodiment, the sensitive line scan is performed prior to generating 2D FT data, but this order of performance is not necessary. The 2D FT data may be generated prior to the sensitive line scan. Additional advantages and modifications will readily occur to those skilled in the art. The invention in its broader aspects is therefore not limited to the specific details, representative steps, and illustrative example shown and described. Accordingly, departures may be made from such details without departing from the spirit or scope of the applicant's general inventive concept.

What is claimed is:

1. A method for correcting phase errors in magnetic resonance imaging data from an object under observation, comprising the steps of:
    a. subjecting said object to magnetic field gradients and radio frequency pulses to produce sensitive line data and two dimensional Fourier transform (2D FT) magnetic resonance imaging data from said object, said magnetic field gradients defining a Fourier space, with said sensitive line data passing through Y=0 in said Fourier space and said 2D FT data lying along stepped paths in said Fourier space;
    b. measuring the phase of said sensitive line data at Y=0 in said Fourier space;
    c. modifying said sensitive line data as a function of said measured phase to obtain corrected sensitive line data which is equivalent to said sensitive line data with the effect of a first phase error in said sensitive line data removed;
    d. calculating a second phase error in said 2D FT data on each of said stepped paths as a function of said corrected sensitive line data and the sum of said 2D FT data for each of said stepped paths;
    e. modifying said 2D FT data on each of said stepped paths as a function of said calculated second phase errors for each respective path to obtain corrected 2D FT data for each path which is the equivalent of said 2D FT data for each path with the effect of said respective second phase errors for each path removed; and
    f. constructing a visual magnetic resonance image from the inverse two dimensional Fourier transform of said corrected 2D FT data.

2. A method of claim 1 wherein said step of calculating further comprises calculating a difference between the phase of said sum of said 2D FT data on each one of said stepped paths and the phase of said corrected sensitive line data at values of Y corresponding to the Y values of each of said stepped paths, said difference for each stepped path equalling said second phase error in said 2D FT data for each stepped path.

3. A method of claim 1 wherein said step of subjecting includes adjusting said magnetic field gradients and said radio frequency signals to result in said sensitive line data for a particular value of Y in said Fourier space corresponding to the sum of said 2D FT data along a line parallel to the X-axis of said Fourier space and having the same said particular Y value.

4. A method for correcting phase errors in magnetic resonance imaging (MRI) data resulting from quadrature demodulator reference oscillator signal frequency instabilities, said data being used to construct an image of an object subject to magnetic gradient fields, by inverse two dimensional Fourier transform of said MRI data from a two dimensional Fourier space extending in X and Y directions, to a signal intensity per unit area of said object in x and y directions, where X is defined as:

$$X(t) = \frac{\gamma}{2\pi} \int_0^t g_x(\tau)d\tau, \text{ and}$$

where $g_x(\tau)$ is the magnetic gradient field through said object in said x direction, $\gamma$ is the magnetogyric ratio, and Y is defined as:

$$Y(t) = \frac{\gamma}{2\pi} \int_0^t g_y(\tau)d\tau, \text{ and}$$

where $g_y(\tau)$ is the magnetic gradient field through said object in said y direction, such method comprising the steps of:
    a. generating magnetic resonance imaging sensitive line data, represented by a function P(O,Y), with P(O,Y) being the Fourier transform with respect to Y of a signal intensity per unit length of said object along a narrow linear volume passing through said object;

b. measuring, at Y=0 in said Fourier space, the phase term present in P(O,Y), which phase term equals a phase error in said function P(O,Y) at Y=0;

c. correcting said function P(O,Y) to remove the effects of said phase error and thereby obtain corrected sensitive line data;

d. generating magnetic resonance imaging system 2D FT data, represented by a function G(X,Y), which lies along a plurality of stepped paths parallel to the X-axis in said two dimensional Fourier space, the phase of the sum of said 2D FT data along one of said stepped paths corresponding to the phase of said sensitive line data for a corresponding Y value in said two dimensional Fourier space;

e. calculating a function F(X,Y) for each of said stepped paths, where $Y = m \cdot \Delta Y$ for a given path, m, and $\Delta Y$ is the Y-axis distance between said paths, where F(X,Y) is a two dimensional Fourier transform with respect to X and Y of said signal intensity per unit area of said object such that:

$$F(X,Y) = \frac{P(O,Y) \cdot G(X,Y)}{\int_{-\infty}^{+\infty} G(X,Y)dX} \ ; \text{ and}$$

f. constructing a visual magnetic resonance image from the inverse two dimensional Fourier transform of F(X,Y).

5. A method of claim 4 wherein said steps of generating magnetic resonance imaging sensitive line data, and generating magnetic resonance imaging 2D FT data comprise use of digital data sampling techniques to generate discrete data values; said steps of measuring, at Y=0 in said Fourier space, the phase error, correcting said function P(O,Y) to remove the effects of said phase error, said step of calculating a function F(X,Y), and said step of constructing a visual magnetic resonance image each comprise use of digital calculations using discrete data points.

* * * * *